US012764664B2

(12) United States Patent
Hsu et al.

(10) Patent No.: US 12,764,664 B2
(45) Date of Patent: Oct. 13, 2026

(54) COMMUNICATION DEVICE AND CONTROL METHOD FOR REDUCING POWER CONSUMPTION

(71) Applicant: Airoha Technology Corp., Hsinchu (TW)

(72) Inventors: Chia-Hsing Hsu, New Taipei City (TW); Yi-Ching Chen, New Taipei City (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 429 days.

(21) Appl. No.: 18/469,662

(22) Filed: Sep. 19, 2023

(65) Prior Publication Data

US 2025/0097844 A1 Mar. 20, 2025

(51) Int. Cl.
*H04W 52/02* (2009.01)
*H03B 5/32* (2006.01)

(52) U.S. Cl.
CPC ... *H04W 52/0235* (2013.01); *H04W 52/0274* (2013.01); *H03B 5/32* (2013.01)

(58) Field of Classification Search
CPC ...................... H04W 52/0235; H04W 52/0274
USPC .......................................................... 370/311
See application file for complete search history.

(56) References Cited

U.S. PATENT DOCUMENTS 11,740,678 B2 8/2023 Laurent
2012/0314738 A1* 12/2012 Kashima ............... H04J 3/0697 375/219
2014/0157023 A1 6/2014 Katou
2021/0173099 A1* 6/2021 Yahata ................. H03K 5/1534
2022/0345417 A1* 10/2022 Kasichainula .......... H04L 47/30

FOREIGN PATENT DOCUMENTS

CN 1236531 A * 11/1999 .......... H04W 52/029
TW I741533 B 10/2021
TW I742769 B 10/2021

OTHER PUBLICATIONS

Chinese language office action dated Jul. 18, 2024, issued in application No. TW 112140766.

* cited by examiner

*Primary Examiner* — Faisal Choudhury
(74) *Attorney, Agent, or Firm* — McClure, Qualey & Rodack, LLP

(57) ABSTRACT

A communication device includes a crystal oscillator, an auxiliary circuit, and a control circuit. The crystal oscillator provides a clock for operation of the communication device in a second mode. The auxiliary circuit includes an accumulator and a comparator. The accumulator counts a number according to an MDI (Medium Dependent Interface) signal. The comparator compares the number with a threshold. If the number is greater than or equal to the threshold, the comparator will output a wakeup signal. The control circuit switches from the second mode to a first mode in response to a control signal, and switches from the first mode to the second mode in response to the wakeup signal. In the first mode, the control circuit disables the crystal oscillator and enables the auxiliary circuit. In the second mode, the control circuit enables the crystal oscillator.

10 Claims, 4 Drawing Sheets

COMMUNICATION DEVICE AND CONTROL METHOD FOR REDUCING POWER CONSUMPTION

BACKGROUND OF THE INVENTION

Field of the Invention

The disclosure generally relates to a communication device, and more specifically, to a communication device for reduction of power consumption.

Description of the Related Art

Power consumption is an important issue, especially in view of the rapidly increasing utilization of the Internet. Relative circuitry based on conventional designs consumes too much power, largely due to the use of an always-on crystal oscillator. Accordingly, there is a need to propose a novel solution for solving the problem of the prior art.

BRIEF SUMMARY OF THE INVENTION

In an exemplary embodiment, the invention is directed to a communication device that includes a crystal oscillator, an auxiliary circuit, and a control circuit. The crystal oscillator provides a clock for operation of the communication device in a second mode. The auxiliary circuit includes an accumulator and a comparator. The accumulator counts a number according to an MDI (Medium Dependent Interface) signal. The comparator compares the number with a threshold. If the number is greater than or equal to the threshold, the comparator will output a wakeup signal. The control circuit switches from the second mode to a first mode in response to a control signal, and switches from the first mode to the second mode in response to the wakeup signal. In the first mode, the control circuit disables the crystal oscillator and enables the auxiliary circuit. In the second mode, the control circuit enables the crystal oscillator.

In some embodiments, in response to the control signal indicating a link-down state, the control circuit enters the first mode.

In some embodiments, in response to the wakeup signal with a high logic level, the control circuit leaves the first mode and enters the second mode.

In some embodiments, in the second mode, the control circuit disables the auxiliary circuit.

In some embodiments, the accumulator includes an adder and a register, and the number is stored in the register.

In some embodiments, in the second mode, the control circuit resets the number stored in the register.

In some embodiments, the MDI signal is an NLP (Normal Link Pulse) signal or an NRZ (Non-Return-to-Zero) signal.

In some embodiments, the accumulator increases the number by 1 once the accumulator receives the MDI signal.

In some embodiments, the threshold is adjustable.

In some embodiments, the comparator has a positive input terminal for receiving the number, a negative input terminal for receiving the threshold, and an output terminal for selectively outputting the wakeup signal.

In another exemplary embodiment, the invention is directed to a communication device that includes a crystal oscillator and an auxiliary circuit. The crystal oscillator is configured to be powered down in a first mode where the crystal oscillator does not provide a clock for operation of the communication device, and to be powered up in a second mode where the crystal oscillator provides the clock. The auxiliary circuit is configured to provide a wakeup signal in response to a medium dependent interface (MDI) signal. The crystal oscillator switches from the first mode to the second mode in response to the wakeup signal.

In some embodiments, the auxiliary circuit includes an accumulator and a comparator. The accumulator counts a number according to the MDI signal. The comparator compares the number with a threshold. If the number is greater than or equal to the threshold, the comparator will output the wakeup signal.

In another exemplary embodiment, the invention is directed to a control method used for a communication device, and it includes the steps of: counting a number according to an MDI (Medium Dependent Interface) signal; comparing the number with a threshold; if the number is greater than or equal to the threshold, outputting a wakeup signal; and powering up a powered-down crystal oscillator for providing a clock for operation of the communication device.

In some embodiments, the control method further includes: increasing the number by 1 once the MDI signal is received.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
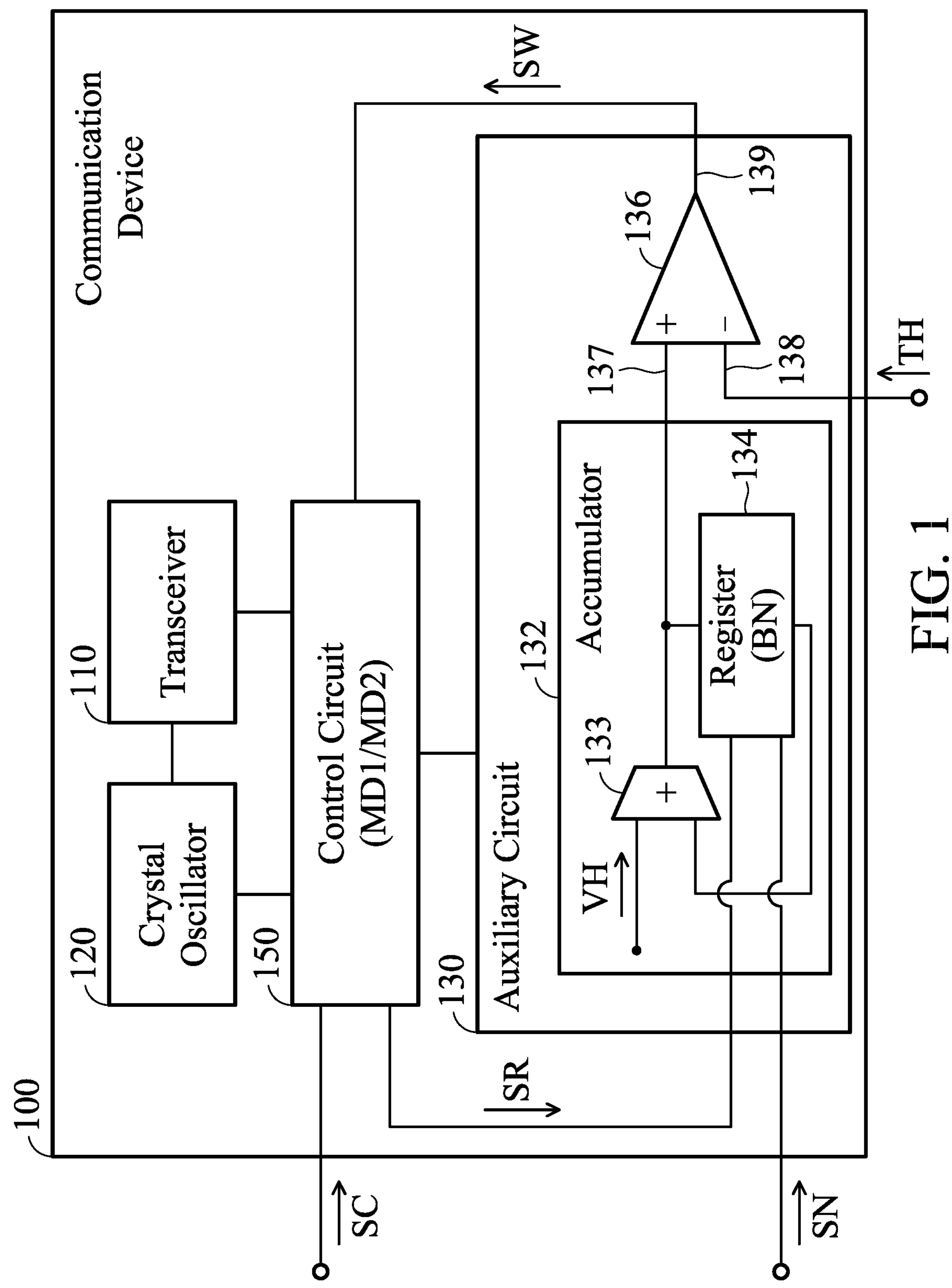
FIG. 1 is a diagram of a communication device according to an embodiment of the invention.

In order to illustrate the purposes, features and advantages of the invention, the embodiments and figures of the invention are shown in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagram of a communication device 100 according to an embodiment of the invention. The communication device 100 may be applied to a network, such as the Internet. For example, the communication device 100 functions to handle communication in physical layer of an open system interconnection (OSI) model. In the embodiment of FIG. 1, the communication device 100 includes a transceiver 110, a crystal oscillator 120, an auxiliary circuit 130, and a control circuit 150. It should be understood that the communication device 100 may further include other components, such as a cable and a hub, although they are not displayed in FIG. 1.

The transceiver 110 may include a transmitter (TX) and a receiver (RX) (not shown). The crystal oscillator 120 is coupled to the transceiver 110. For example, the crystal oscillator 120 may provide a clock of an oscillation signal for the transceiver 110. Without the oscillation signal, the communication device 100 is unable to work normally since, for example, a digital circuit, such as a latch, of the communication device 100 requires the clock to sample signals.

The auxiliary circuit 130 includes an accumulator 132 and a comparator 136. Specifically, the functions of the above elements of the auxiliary circuit 130 will be described as follows.

The accumulator 132 can count a number BN according to an MDI (Medium Dependent Interface) signal SN. In some embodiments, the accumulator 132 increases the number BN by 1 once the accumulator 132 receives a pulse of the MDI signal SN, but it is not limited thereto. For example, the MDI signal SN may be used as a clock of the accumulator 132, but it is not limited thereto. It should be noted that the MDI signal SN applied to the accumulator 132 is not from the crystal oscillator 120. Thus, the accumulator 132 can be operated normally even if the crystal oscillator 120 is disabled. The number BN may be an integer.

In some embodiments, the MDI signal SN is an NLP (Normal Link Pulse) signal or an NRZ (Non-Return-to-Zero) signal. For example, the NLP signal may be sent by a link partner (not shown), and the link partner may be another network device which is different from and independent from the communication device 100, and is connected to the communication device 100 via a wire. The NLP signal is used to check whether the link between two communication devices is up or down. That is, whenever the communication device 100 is in a link down state, the link partner continuously sends the NLP signal to request the link status to be brought back up.

In some embodiments, the accumulator 132 includes an adder 133 and a register 134, but it is not limited thereto. The adder 133 can receive a reference voltage VH, which may be considered as a digital number "1". The register 134 is coupled to the adder 133. The register 134 can store the number BN. For example, if the accumulator 132 receives a high logic pulse of the MDI signal SN, the adder 133 may increase and update the number BN stored in the register 134. In further detail, the register 134 outputs the stored number BN to the adder 133 in response to a pulse of the MDI signal SN. The adder 133 then updates the stored number BN from the register 134 by adding the digital number "1" to the stored number BN.

The comparator 136 is coupled to the register 134. The comparator 136 can compare the number BN from the adder 133 with a threshold TH. In some embodiments, the threshold TH is adjustable, and it is stored in another register (not shown). For example, the threshold TH may be any integer selected from 16 to 256 according to different design requirements, but it is not limited.

It should be noted that if the number BN is greater than or equal to the threshold TH, the comparator 136 will output a wakeup signal SW with a high logic level (e.g., a logic "1"). Conversely, if the number BN is smaller than the threshold TH, the comparator 136 will not output any wakeup signal SW, or will keep the wakeup signal SW at a low logic value (e.g., a logic "0"). Specifically, the comparator 136 has a positive input terminal 137 for receiving the number BN from the register 134, a negative input terminal 138 for receiving the threshold TH, and an output terminal 139 for selectively outputting the wakeup signal SW.

Figure 2:
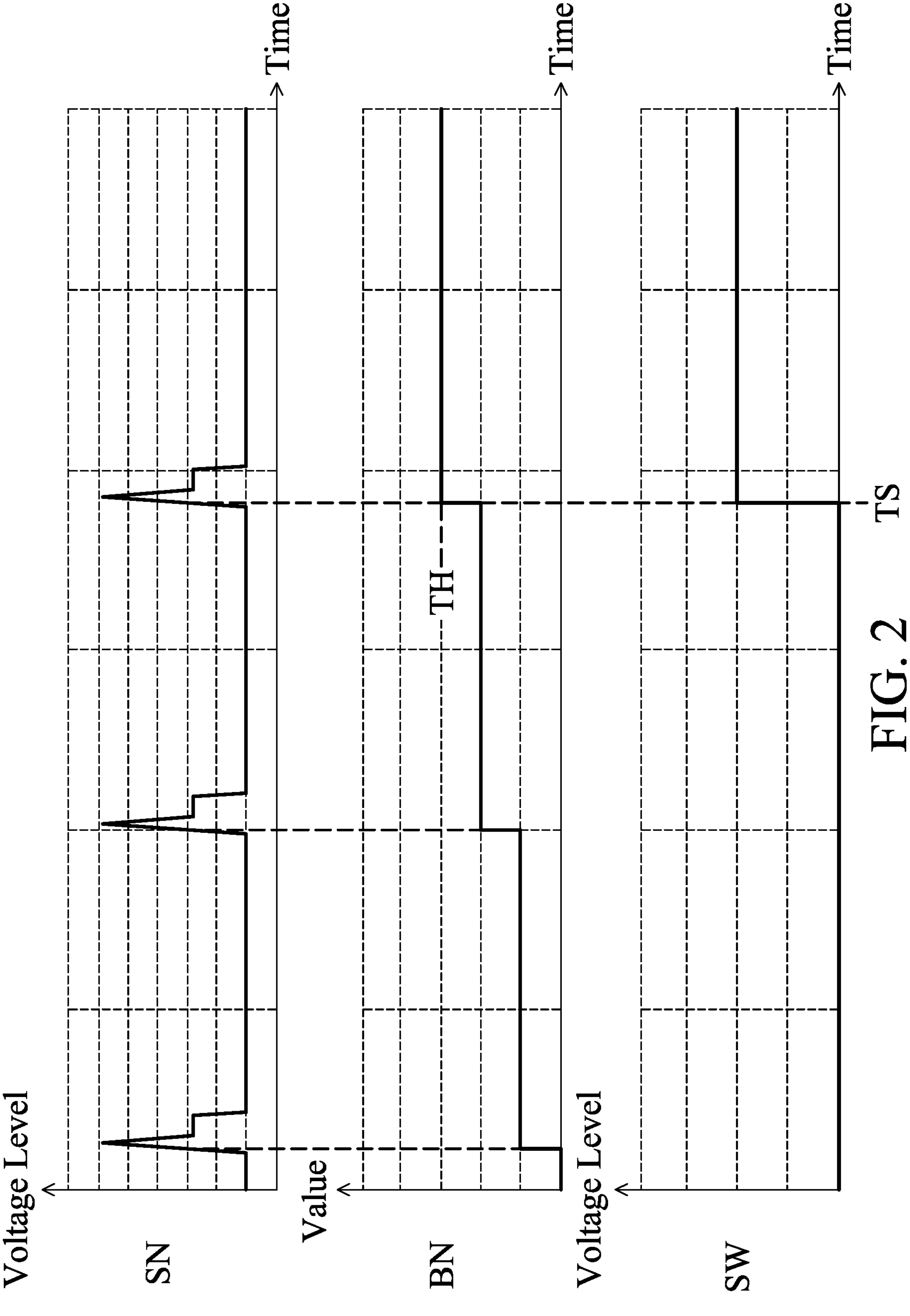
FIG. 2 is a diagram of signal waveforms of an auxiliary circuit according to an embodiment of the invention.

FIG. 2 is a diagram of signal waveforms of the auxiliary circuit 130 according to an embodiment of the invention. The horizontal axis represents time, and each vertical axis represents a voltage level or a value. In the embodiment of FIG. 2, the MDI signal SN is an external NLP signal specified in the IEEE (Institute of Electrical and Electronics Engineers) 802.3 standard. For example, the threshold TH may be set to 3.

In operation, initially, the auxiliary circuit 130 may be disabled, and the number BN stored in the register 134 may be reset to 0. Then, the auxiliary circuit 130 may be enabled, and the accumulator 132 may increase and update the number BN stored in the register 134 by 1 once the accumulator 132 receives a pulse of the MDI signal SN. At a specific time point TS, when the number BN is equal to the threshold TH, the comparator 136 may switch the wakeup signal SW from a low logic level to a high logic level (because 3 high logic pulses of the MDI signal SN have been already received). The wakeup signal SW can be arranged to wake up another element, and it will be described in detail over the following embodiments. It should be noted the threshold TH is adjustable. By setting a higher threshold TH, false alarms can be effectively avoided since the noise signal may have a pulse. In alternative embodiments, the auxiliary circuit 130 can be used independently, and the auxiliary circuit 130 doesn't necessarily have to be a part of the communication device 100.

Please refer to FIG. 1 again. The control circuit 150 is coupled to the transceiver 110, the crystal oscillator 120, and the auxiliary circuit 130. In addition, the control circuit 150 can selectively operate in an LDPS (Link Down Power Saving) mode MD1 or a normal mode MD2 according to a control signal SC and the wakeup signal SW. For example, the LDPS mode MD1 may be considered as a first mode, and the normal mode MD2 may be considered as a second mode, but they are not limited thereto.

The control signal SC may be an internal signal or an external signal. Specifically, the control signal SC is arranged to indicate whether the communication device 100 enters a link-down state. For example, if the communication device 100 is connected to another communication device, it may be considered that the communication device 100 enters a link up state; conversely, if the communication device 100 is disconnected from all of the other communication devices, it may be considered that the communication device 100 enters a link-down state. Based on the link-down state, the communication device 100 should reduce its overall power consumption. In some embodiments, if the control signal SC has a low logic level, it will indicate that the communication device 100 enters the link-down state, and if the control signal SC has a high logic level, it will indicate that the communication device 100 leaves the link-down state, but they are not limited thereto.

Initially, the control circuit 150 may operate in the normal mode MD2. Next, in response to the control signal SC indicating the aforementioned link-down state, the control circuit 150 may leave the normal mode MD2 and enter the LDPS mode MD1. In the LDPS mode MD1, the control circuit 150 can disable both the transceiver 110 and the crystal oscillator 120, and can enable the auxiliary circuit 130. At this time, the control circuit 150 can stop transmitting any reset signal SR to the accumulator 132, and the accumulator 132 can start to count the number BN according to the MDI signal SN. It should be noted that the accumulator 132 does not need to receive any clock from the crystal oscillator 120. Therefore, the crystal oscillator 120 can be completely turned off for more reduction of power consumption during the LDPS mode MD1.

Finally, when the number BN stored in the register 134 and updated by the adder 133 reaches the threshold TH, the comparator 136 can output the wakeup signal SW with a high logic level. In response to the wakeup signal SW with the high logic level, the control circuit 150 can leave the LDPS mode MD1 and enter the normal mode MD2. In the normal mode MD2, the control circuit 150 can enable both the transceiver 110 and the crystal oscillator 120, and can disable the auxiliary circuit 130. At this time, the control circuit 150 can also transmit a reset signal SR to the accumulator 132, so as to reset the number BN stored in the register 134. That is, the number BN may be always kept at 0 during the normal mode MD2.

In some embodiments, the control circuit 150 switches from the normal mode MD2 to the LDPS mode MD1 in response to the control signal SC, and switches from the LDPS mode MD1 to the normal mode MD2 in response to the wakeup signal SW.

Figure 3:
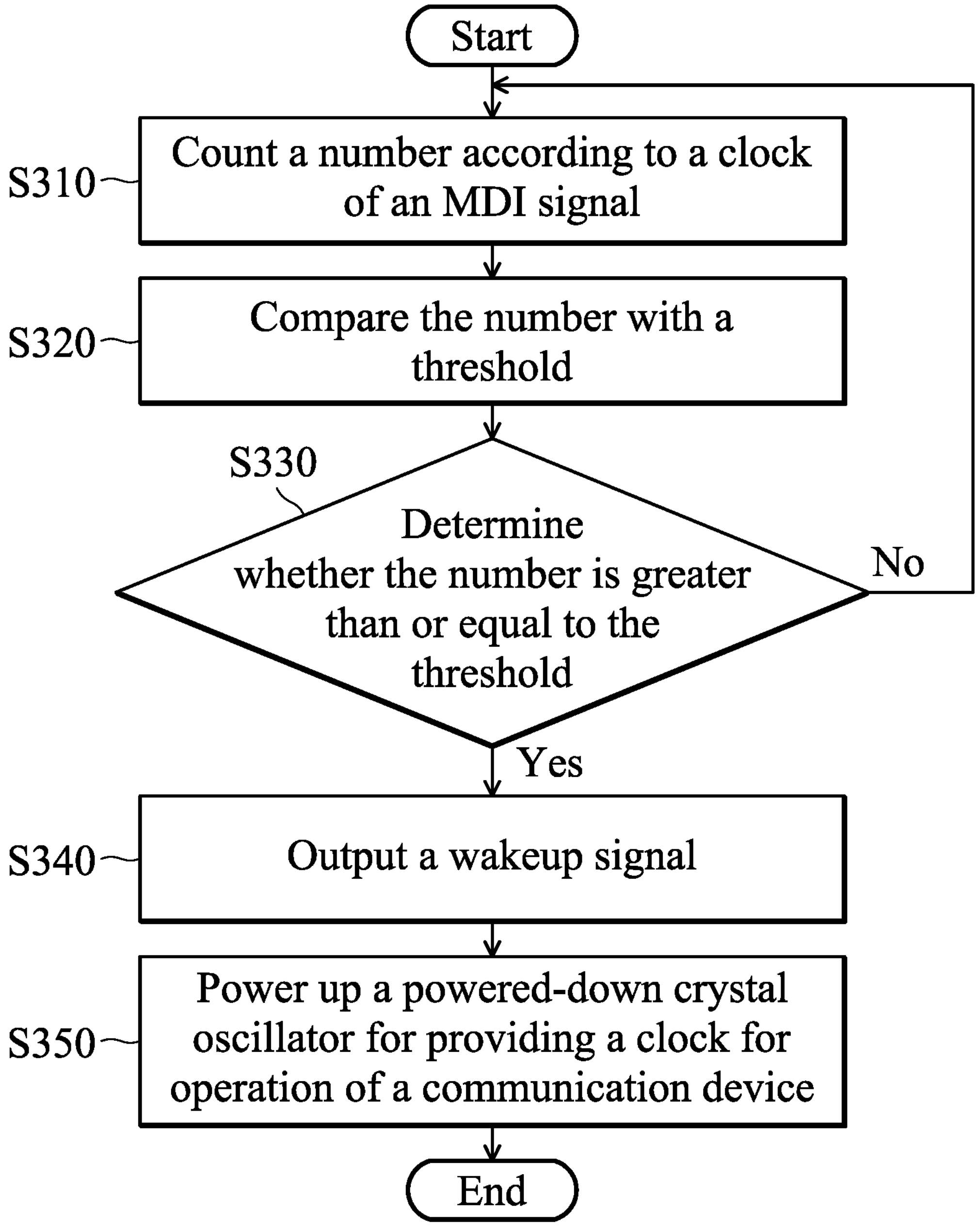
FIG. 3 is a flowchart of a control method according to an embodiment of the invention.

FIG. 3 is a flowchart of a control method according to an embodiment of the invention. The aforementioned control method includes the following steps. In step S310, a number is counted according to an MDI signal. For example, the MDI signal may be used as a clock, but it is not limited thereto. In step S320, the number is compared with a threshold. In step S330, it is determined whether the number is greater than or equal to the threshold. If not, the procedure will go back to step S310. If so, in step S340, a wakeup signal is outputted. Next, in step S350, a powered-down crystal oscillator is powered up for providing a clock for operation of a communication device. It should be noted that the above steps are not required to be performed in order, and all of the features of the embodiments of FIGS. 1 and 2 may be applied to the control method of FIG. 3.

Figure 4:
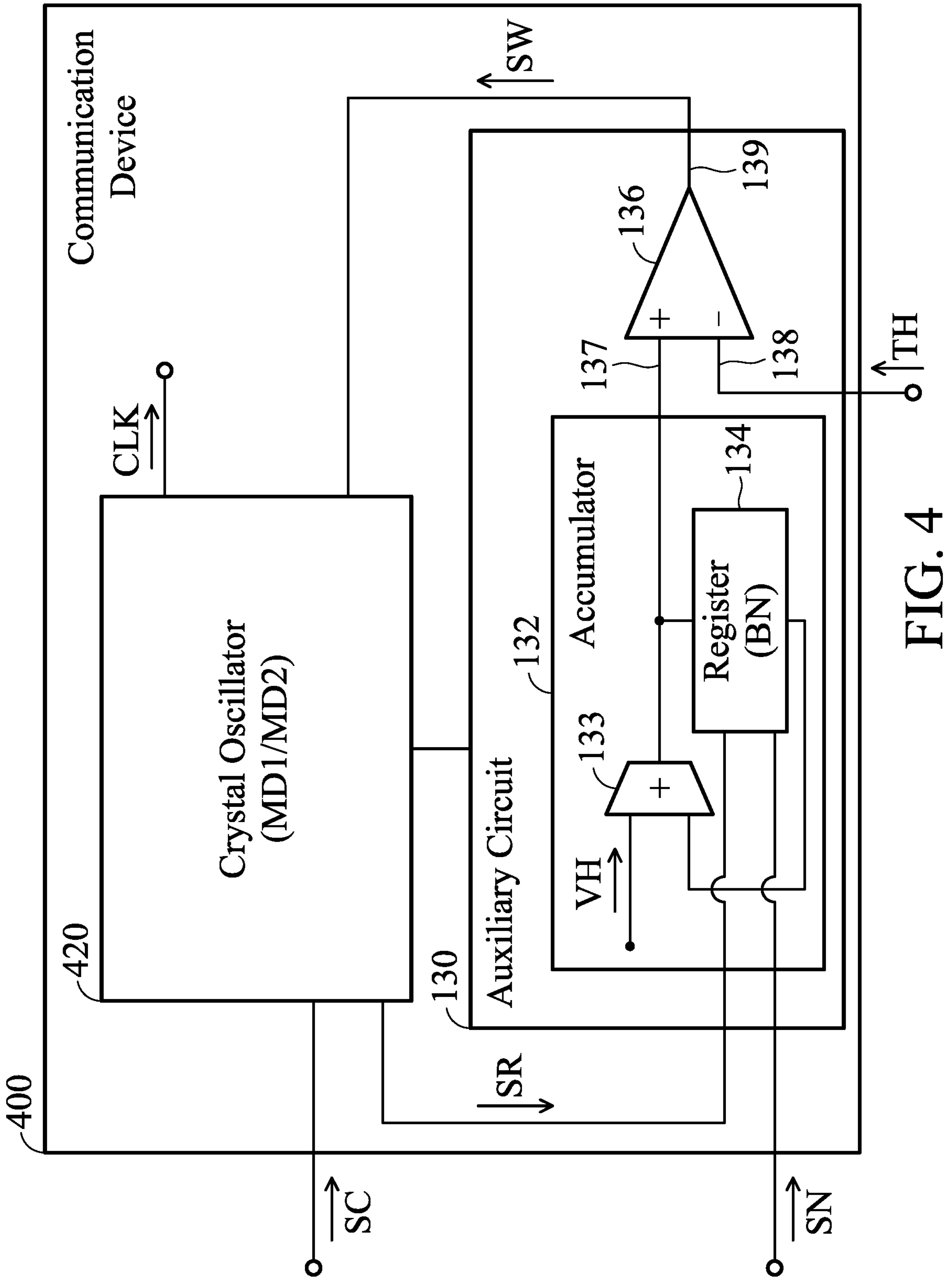
FIG. 4 is a diagram of a communication device according to another embodiment of the invention.

FIG. 4 is a diagram of a communication device 400 according to another embodiment of the invention. FIG. 4 is similar to FIG. 1. However, in the embodiment of FIG. 4, the communication device 400 merely includes a crystal oscillator 420 and the auxiliary circuit 130 as mentioned above. The crystal oscillator 420 may be integrated with the aforementioned control circuit, and it can also selectively operate in the LDPS mode MD1 or the normal mode MD2. The crystal oscillator 420 is configured to be powered down in the LDPS mode MD1, where the crystal oscillator 420 does not provide a clock CLK for operation of the communication device 400. Alternatively, the crystal oscillator 420 is configured to be powered up in the normal mode MD2, where the crystal oscillator 420 provides the clock CLK. The auxiliary circuit 130 is configured to provide the wakeup signal SW in response to the MDI signal SN. In further detail, when the number BN, which is based on the MDI signal SN, reaches the threshold TH, the wakeup signal SW is output. The crystal oscillator 420 switches from the LDPS mode MD1 to the normal mode MD2 in response to the wakeup signa SW. Other features of the communication device 400 of FIG. 4 are similar to those of the communication device 100 of FIG. 1. Therefore, the two embodiments can achieve similar levels of performance.

The invention proposes a novel communication device and a novel control method thereof. Compared to the conventional design, the invention has at least the advantage of effectively reducing the overall power consumption, and therefore it is suitable for application in a variety of devices.

In some existing communication devices, in the LDPS mode, for power conservation, most components (e.g., transmitters) of the communication devices are powered down. However, the crystal oscillator must remain powered on to provide a clock signal, ensuring digital circuits of the communication devices can process the NLP signal. If the crystal oscillator is powered down, the NLP signal may not be detected. Consequently, it is difficult to further reduce the power consumption of such existing communication devices. In the present invention, with the help of the auxiliary circuit 130, the crystal oscillator 120 is allowed to be powered down. Although the auxiliary circuit 130 may consume power, the power consumption of the auxiliary circuit 130 is negligible compared to that of the crystal oscillator 120. As a result, the power consumption of the communication device 100 equipped with the auxiliary circuit 130 is relatively low.

Note that the above element parameters are not limitations of the invention. A designer can fine-tune these settings or values according to different requirements. It should be understood that the communication device and the control method of the invention are not limited to the configurations of FIGS. 1-4. The invention may merely include any one or more features of any one or more embodiments of FIGS. 1-4. In other words, not all of the features displayed in the figures should be implemented in the communication device and the control method of the invention.

The method of the invention, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A communication device, comprising:

a crystal oscillator, providing a clock for operation of the communication device in a second mode;

an auxiliary circuit, comprising:

an accumulator, counting a number according to an MDI (Medium Dependent Interface) signal; and a comparator, comparing the number with a threshold, wherein if the number is greater than or equal to the threshold, the comparator outputs a wakeup signal; and a control circuit, switching from the second mode to a first mode in response to a control signal, and switching from the first mode to the second mode in response to the wakeup signal;

wherein in the first mode, the control circuit disables the crystal oscillator and enables the auxiliary circuit;

wherein in the second mode, the control circuit enables the crystal oscillator.

2. The communication device as claimed in claim 1, wherein in response to the control signal indicating a link-down state, the control circuit enters the first mode.

3. The communication device as claimed in claim 1, wherein in response to the wakeup signal with a high logic level, the control circuit leaves the first mode and enters the second mode.

4. The communication device as claimed in claim 1, wherein in the second mode, the control circuit disables the auxiliary circuit.

5. The communication device as claimed in claim 1, wherein the accumulator comprises an adder and a register, and the number is stored in the register.

6. The communication device as claimed in claim 5, wherein in the second mode, the control circuit resets the number stored in the register.

7. The communication device as claimed in claim 1, wherein the MDI signal is an NLP (Normal Link Pulse) signal or an NRZ (Non-Return-to-Zero) signal.

8. The communication device as claimed in claim 1, wherein the accumulator increases the number by 1 once the accumulator receives the MDI signal.

9. The communication device as claimed in claim 1, wherein the threshold is adjustable.

10. The communication device as claimed in claim 1, wherein the comparator has a positive input terminal for receiving the number, a negative input terminal for receiving the threshold, and an output terminal for selectively outputting the wakeup signal.

* * * * *